United States Patent
Li et al.

(10) Patent No.: US 11,463,031 B2
(45) Date of Patent: *Oct. 4, 2022

(54) CLOSED-LOOP STEPPER MOTOR CONTROL SYSTEM, DRIVE DEVICE AND AUTOMATION DEVICE

(71) Applicant: CHINA LEADSHINE TECHNOLOGY CO., LTD., Guangdong (CN)

(72) Inventors: Weiping Li, Guangdong (CN); Jianhua Lin, Guangdong (CN); Zhouyong Zhu, Guangdong (CN); Tiansheng Tian, Guangdong (CN); Weili He, Guangdong (CN)

(73) Assignee: CHINA LEADSHINE TECHNOLOGY CO., LTD.

( * ) Notice: Subject to any disclaimer, the term of this patent is extended or adjusted under 35 U.S.C. 154(b) by 0 days.

This patent is subject to a terminal disclaimer.

(21) Appl. No.: 17/271,427

(22) PCT Filed: Sep. 17, 2019

(86) PCT No.: PCT/CN2019/106205
§ 371 (c)(1),
(2) Date: Feb. 25, 2021

(87) PCT Pub. No.: WO2020/057507
PCT Pub. Date: Mar. 26, 2020

(65) Prior Publication Data
US 2021/0336571 A1    Oct. 28, 2021

(30) Foreign Application Priority Data

Sep. 17, 2018  (CN) .......................... 201811084143.X

(51) Int. Cl.
*H02P 8/24* (2006.01)
*H02P 8/36* (2006.01)
(Continued)

(52) U.S. Cl.
CPC ............... *H02P 8/36* (2013.01); *H02M 1/44* (2013.01); *H02P 8/24* (2013.01); *G01R 31/343* (2013.01)

(58) Field of Classification Search
CPC .... H02P 8/36; H02P 8/24; H02M 1/44; G01R 31/343
See application file for complete search history.

(56) References Cited

U.S. PATENT DOCUMENTS

| | | | |
|---|---|---|---|
| 8,629,643 B2 * | 1/2014 | Tachibana | H02P 8/14 318/400.42 |
| 2014/0088767 A1 * | 3/2014 | Shimamura | G05B 19/056 700/275 |
| 2016/0291581 A1 * | 10/2016 | Eguchi | G05B 19/4155 |

FOREIGN PATENT DOCUMENTS

| CN | 202231660 U | 5/2012 |
|---|---|---|
| CN | 205105136 U | 3/2016 |

(Continued)

OTHER PUBLICATIONS

International Search Report for Application No. PCT/CN2019/106205, dated Dec. 18, 2019, pp. 1-2.

*Primary Examiner* — Rina I Duda
(74) *Attorney, Agent, or Firm* — Lerner, David, Littenberg, Krumholz & Mentlik, LLP

(57) ABSTRACT

A closed-loop stepper motor control system, drive device and automation device, wherein the system comprises a microprocessor (1) compatible with EtherCAT communication protocol functions, an external interface circuit (2) connected to the said microprocessor (1) and communication interface unit (3); the said microprocessor (1) is also (Continued)

connected to a drive circuit (4), current testing circuit (5), as well as an encoder feedback circuit (6); the said communication interface unit (3) is mutually connected to the said microprocessor (1) through the physical layer communication circuit (31); the said microprocessor (1) is also mutually connected to the power supply circuit (7) that provides stable power supply voltage.

11 Claims, 9 Drawing Sheets

(51) Int. Cl.
  *H02M 1/44* (2007.01)
  *G01R 31/34* (2020.01)

(56) References Cited

FOREIGN PATENT DOCUMENTS

| | | |
|---|---|---|
| CN | 107317529 A | 11/2017 |
| CN | 208874488 U | 5/2019 |

* cited by examiner

CLOSED-LOOP STEPPER MOTOR CONTROL SYSTEM, DRIVE DEVICE AND AUTOMATION DEVICE

CROSS-REFERENCE TO RELATED APPLICATIONS

The present application is a national phase entry under 35 U.S.C. § 371 of International Application No. PCT/CN2019/106205, filed Sep. 17, 2019, which claims priority from Chinese Patent Application No. 201811084143.X filed Sep. 17, 2018, all of which are incorporated herein by reference.

TECHNICAL FIELD

The present invention involves the field of motor drive technology, particularly a closed-loop stepper motor control system, drive device and automation device.

BACKGROUND ART

At present, stepper driver products on the market are mainly of the pulse command types, that is, sending a pulse signal to the stepper motor driver through a control system. The characteristics of this traditional stepper motor control method are simple operation and mutually independent drivers; however, once the number of motor shafts increase, wiring and maintenance become unusually complicated and the material and labor costs are high, which inconveniences user usage.

Fieldbus technology has good application prospects in the industrial control field due to its advantages such as fast transmission speed, convenient wiring and abundance of information. How to provide a technical solution of applying fieldbus technology to the closed-loop stepper driver and a more reliable and convenient closed-loop motor control system under multi-shaft application scenarios, while saving wiring material and labor costs, has become an urgent issue that needs to be resolved by those of ordinary skill in this art.

SUMMARY OF INVENTION

Technical Problem

The present invention resolves the technical issues by providing a closed-loop stepper motor control system, a drive device and automation device that are more reliable and convenient, and that saves wiring materials and labor costs.

Solution to Problem

Technical Solution

In order to solve the above problems, the invention provides a closed-loop stepper motor control system, wherein it comprises a microprocessor compatible with EtherCAT communication protocol functions, an external interface circuit connected to the said microprocessor and communication interface unit; the said microprocessor is also connected to a drive circuit, current testing circuit, as well as an encoder feedback circuit; the said communication interface unit is mutually connected to the said microprocessor through the physical layer communication circuit; the said microprocessor is also mutually connected to the power supply circuit that provides stable power supply voltage.

Optionally, wherein the said microprocessor uses at least one of the following processors that are compatible with EtherCAT communication protocol functions: ARM processor, DSP processor or FPGA processor.

Optionally, wherein the said external interface circuit comprises a power supply interface unit, winding interface unit and I/O interface unit; the said power supply interface unit is mutually connected to the said power supply circuit, one end of the said winding interface unit is mutually connected to the said drive circuit and the other end is mutually connected to the motor; the said I/O interface unit is mutually connected to the said microprocessor.

Optionally, wherein this system also comprises a brake circuit. One end of the said brake circuit is mutually connected to the I/O interface unit of the said external interface circuit and the other end is mutually connected to the said microprocessor.

Optionally, wherein the said brake circuit comprises a brake drive circuit and brake; the said brake drive circuit comprises an isolation unit and amplifier, the said microprocessor is connected to the said amplifier through the said isolation unit and the said amplifier is used to amplify the current signal coming from the said isolation unit and to output it to the said brake.

Optionally, wherein the said I/O interface unit comprises the first output interface, the second output interface and the third output interface. The said first output interface is connected to the first end of the said brake, the said second output interface is connected to the second end of the said brake and the said third output interface is connected to the power ground of the said brake.

Optionally, wherein the said communication interface unit comprises the physical layer communication circuit and the communication interface. The said communication interface is mutually connected to the microprocessor through the physical layer communication circuit.

Optionally, wherein the said communication interface circuit also comprises an anti-jamming circuit. The said anti-jamming circuit is electrically connected to the said microprocessor through the physical layer communication circuit.

Optionally, wherein the said anti-jamming circuit comprises the first common mode inductor and first transient voltage suppressor. The said transient voltage suppressor is connected to one end of the said first common mode inductor.

Optionally, wherein the said anti-jamming circuit is connected to the first transformer. The said first transformer is electrically connected to the said first common mode inductor and the said first transformer is used to send the signal coming from the said first common mode inductor to the said microprocessor.

Optionally, wherein this system also comprises a DIP switch unit. The said DIP switch unit is mutually connected to the said microprocessor.

Optionally, wherein this system also comprises a display unit. The said display unit is electrically connected to the said microprocessor; of which, the said display unit comprises one or several of the following types: LED indicator light, digital tube and liquid crystal display.

Optionally, wherein this system also comprises an alarm unit. The said alarm unit is electrically connected to the said microprocessor.

In order to solve the above problems, the invention provides a drive device, comprising a motor, wherein the said drive device comprises the closed-loop stepper motor control system as described above.

In order to solve the above problems, the invention provides an automation device, wherein it comprises the drive device as described above.

Advantageous Effects of Invention

Advantageous Effects

The closed-loop stepper motor control system of the present invention comprises: a microprocessor compatible with EtherCAT communication protocol functions, an external interface circuit mutually connected to the microprocessor and communication interface unit; the microprocessor is also connected to a drive circuit, current testing circuit and an encoder circuit;

said communication interface unit is mutually connected to the said microprocessor through the physical layer communication circuit; the said microprocessor is also mutually connected to the power supply circuit that provides stable power supply voltage. The application of fieldbus technology on the stepper motor control system provides greater reliability and convenience to the closed-loop motor control system under the multi-shaft application scenario, through mutual cooperation by the various said modules. In addition, it is able to also save wiring materials and labor costs; high-speed networking enhances the monitoring of devices, drastically increases the overall capacity of resisting interference and increases the overall value of device products.

BRIEF DESCRIPTION OF DRAWINGS

Description of Drawings

Figure 1:
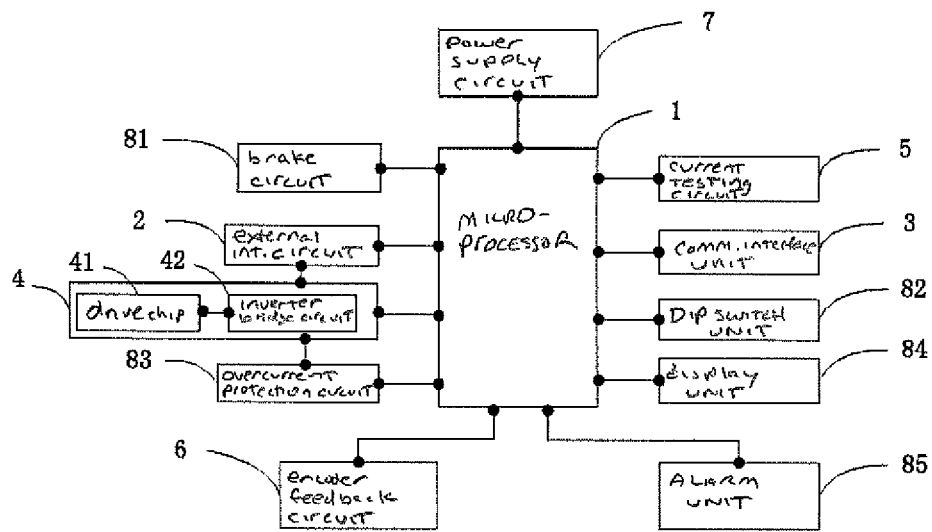
Figure 2:
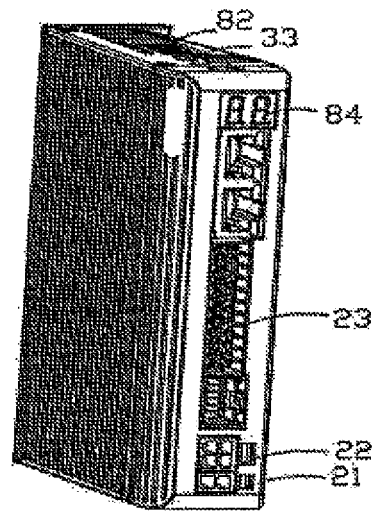
Figure 3:
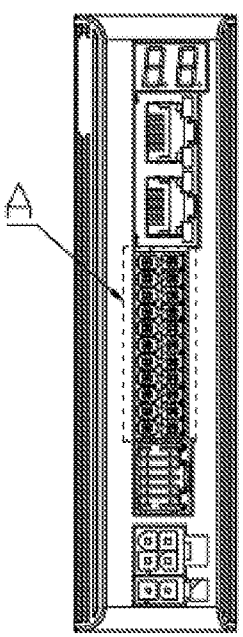
Figure 4:
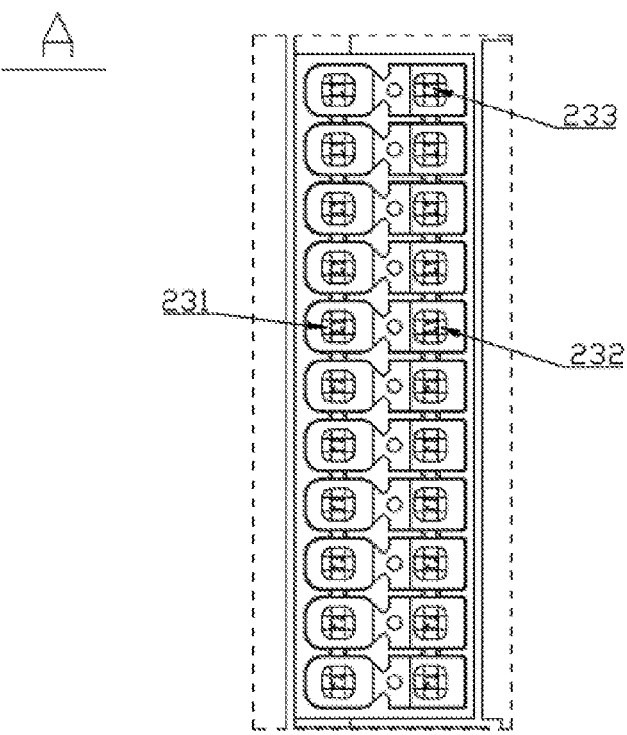
Figure 5:
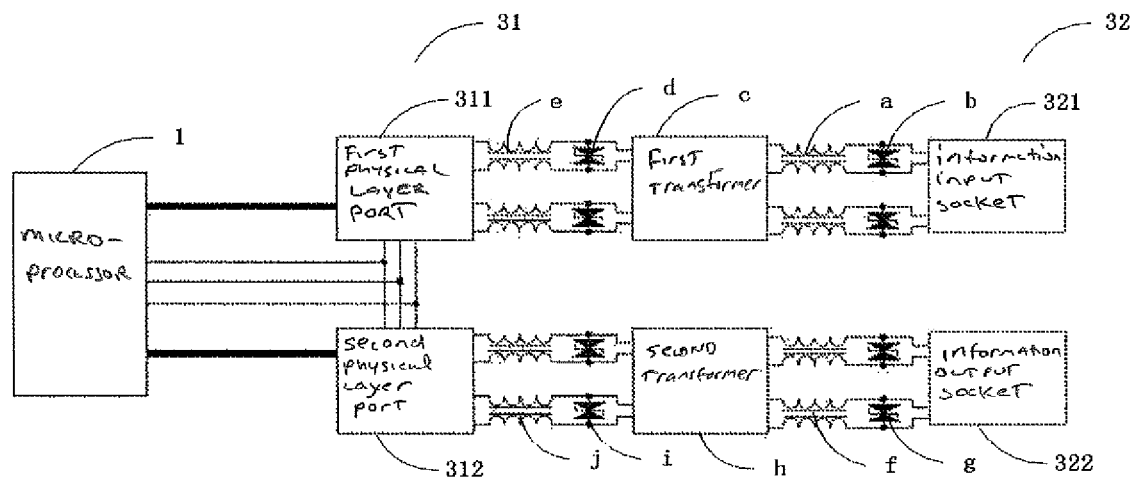
Figure 6:
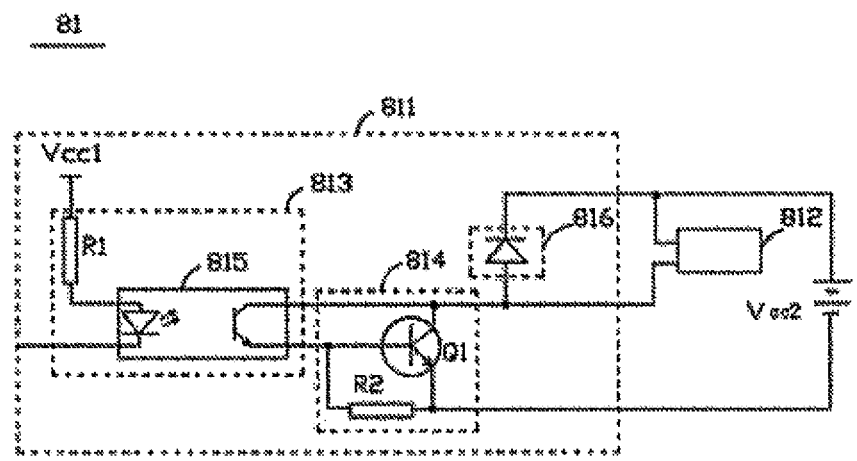
Figure 7:
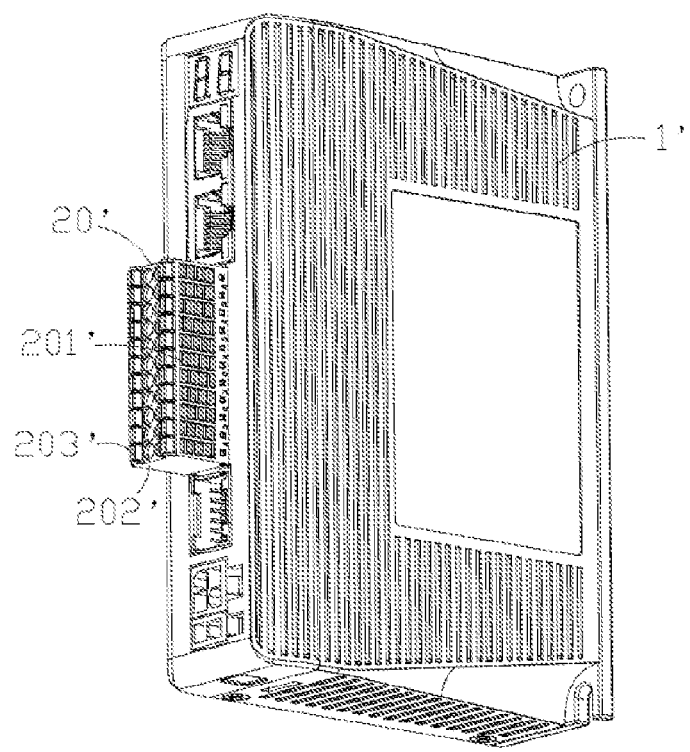
Figure 8:
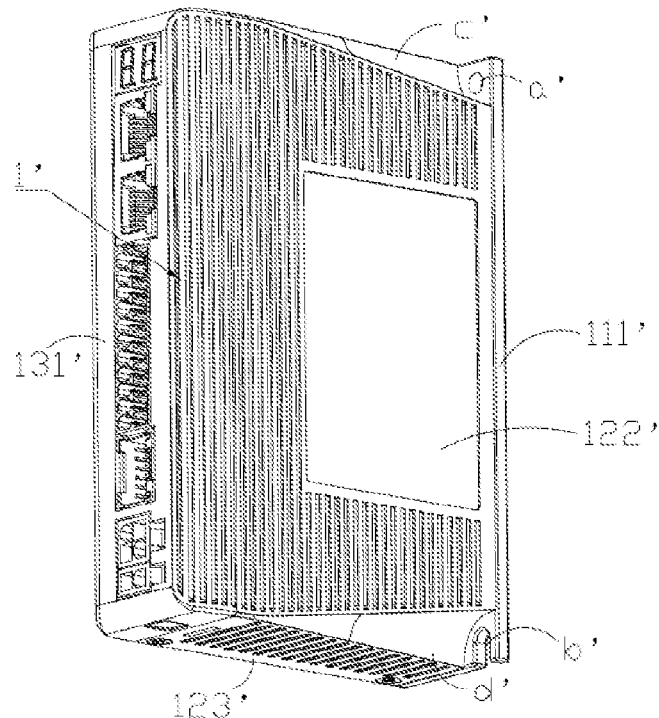
Figure 9:
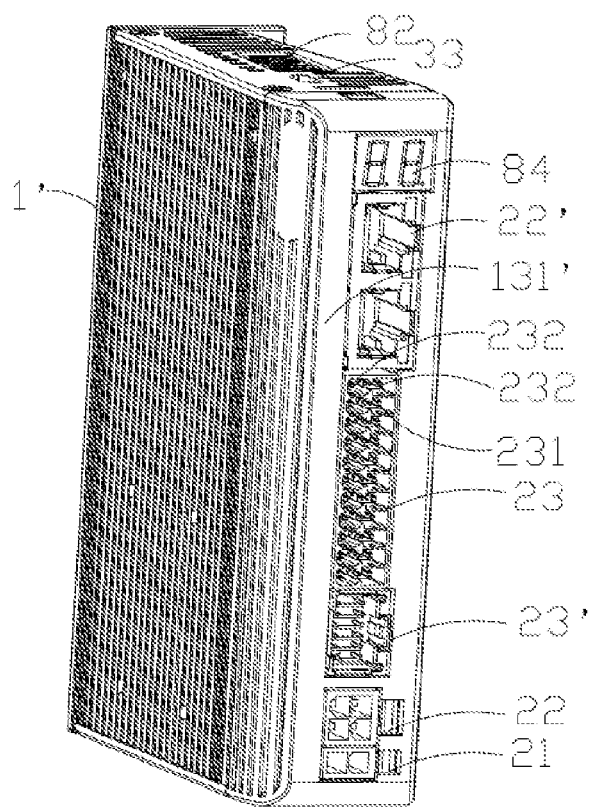
Figure 10:
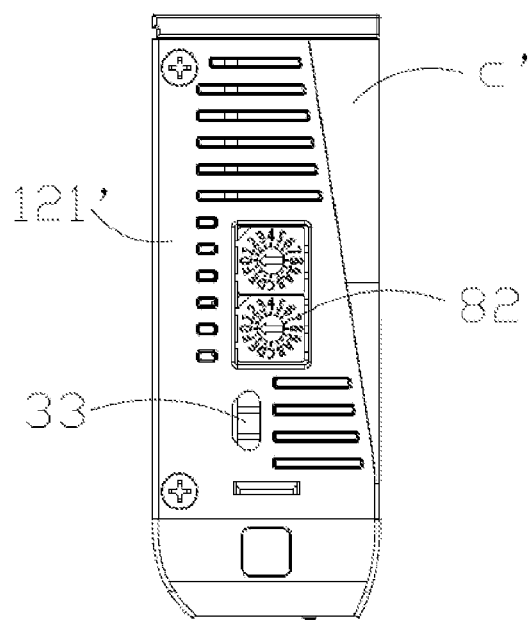
Figure 11:
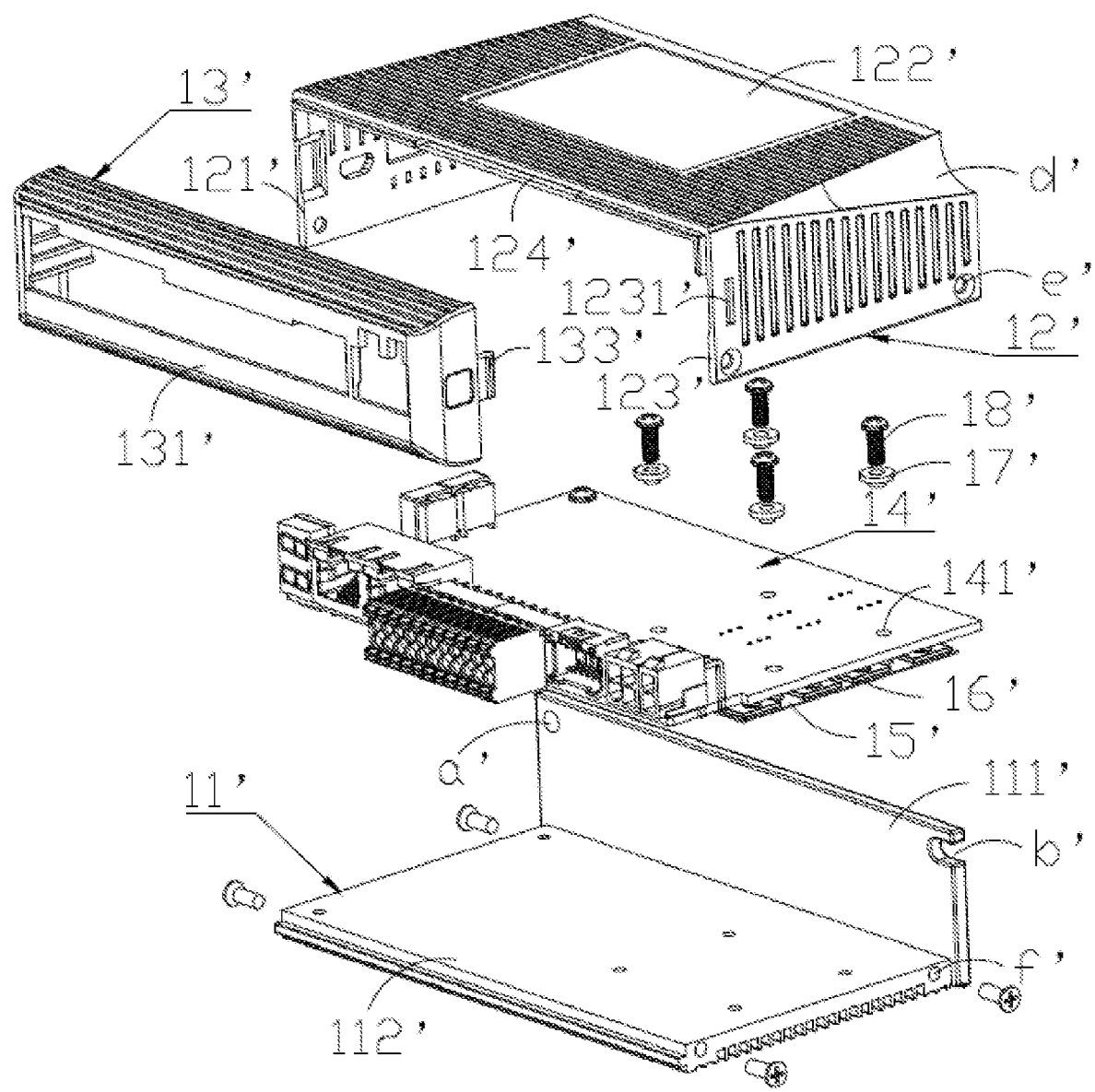
Figure 12:
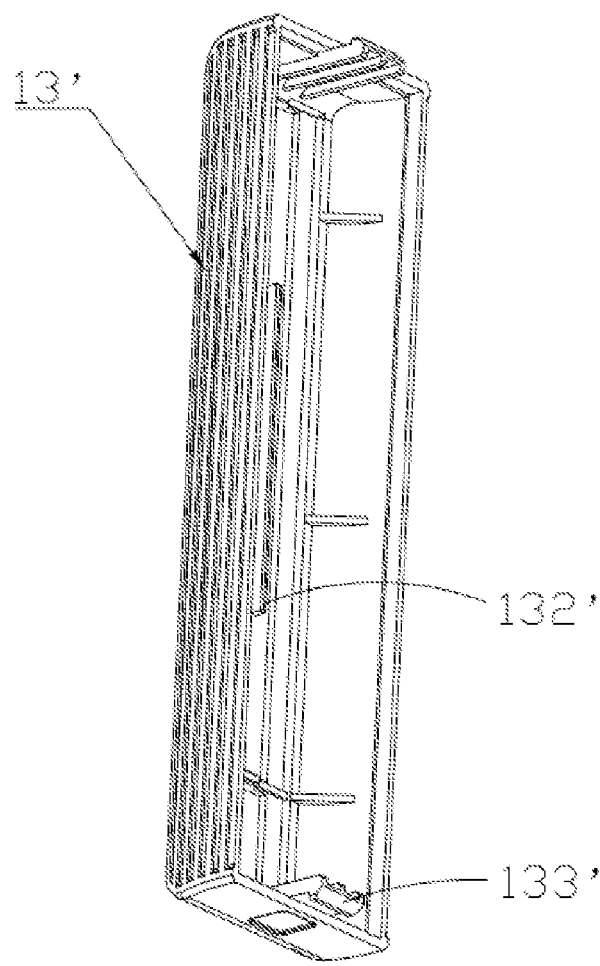
Figure 13:
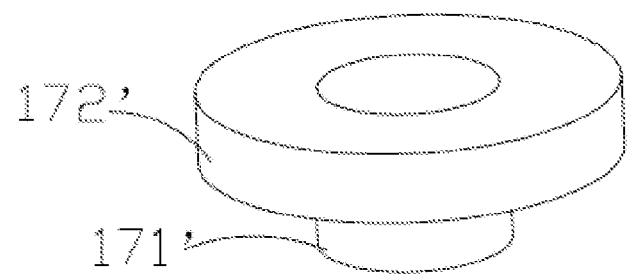
Figure 14:
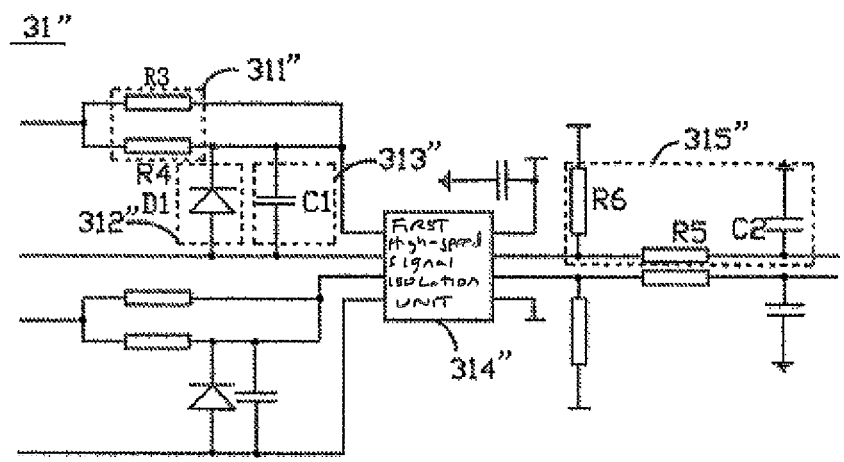

FIG. 1 is the principle block diagram of the first type of embodiment of the closed-loop stepper motor control system of the embodiment of the present invention;

FIG. 2 is the schematic diagram of the closed-loop stepper motor control system of the embodiment of the present invention as shown in FIG. 1;

FIG. 3 is the schematic diagram of another view of FIG. 2;

FIG. 4 is the enlarged diagram of Zone A of FIG. 3;

FIG. 5 is the schematic diagram of the microprocessor's cooperation with the communication interface unit of the embodiment of the present invention as shown in FIG. 1;

FIG. 6 is the circuit diagram of the brake circuit of the embodiment of the present invention as shown in FIG. 1;

FIG. 7 is the schematic diagram of the third type of embodiment of the closed-loop stepper motor control system of the embodiment of the present invention;

FIG. 8 is the schematic diagram of another view of the closed-loop stepper motor control system of the embodiment of the present invention as shown in FIG. 7;

FIG. 9 is the schematic diagram of another view of the closed-loop stepper motor control system of the embodiment of the present invention as shown in FIG. 7;

FIG. 10 is the schematic diagram of another view of the closed-loop stepper motor control system of the embodiment of the present invention as shown in FIG. 7;

FIG. 11 is the exploded view diagram of the closed-loop stepper motor control system of the embodiment of the present invention as shown in FIG. 7;

FIG. 12 is the schematic diagram of the second shell of the closed-loop stepper motor control system of the embodiment of the present invention as shown in FIG. 7;

FIG. 13 is the schematic diagram of the insulation ring of the closed-loop stepper motor control system of the embodiment of the present invention as shown in FIG. 7;

FIG. 14 is the circuit diagram of the high-speed differential input signal processing circuit of the fourth type of embodiment of the closed-loop stepper motor control system of the embodiment of the present invention.

Figure 15:
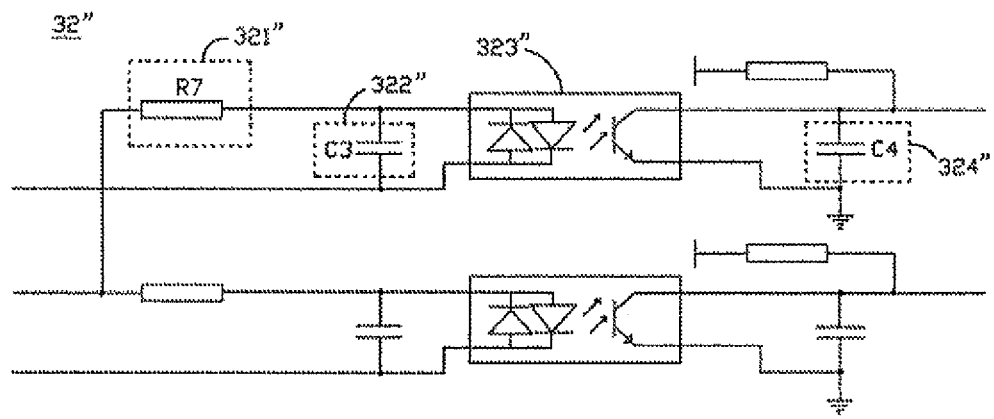

FIG. 15 is the circuit diagram of the low-speed signal input processing circuit of the fourth type of embodiment of the closed-loop stepper motor control system of the embodiment of the present invention.

Figure 16:
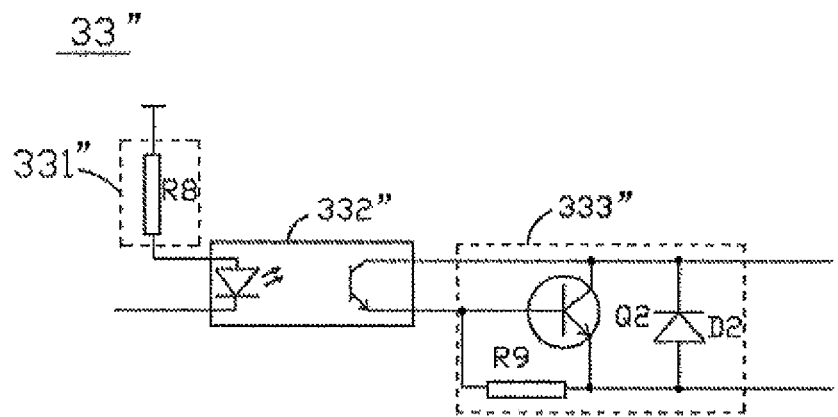

FIG. 16 is the circuit diagram of the low-speed differential output signal processing circuit of the fourth type of embodiment of the closed-loop stepper motor control system of the embodiment of the present invention.

Figure 17:
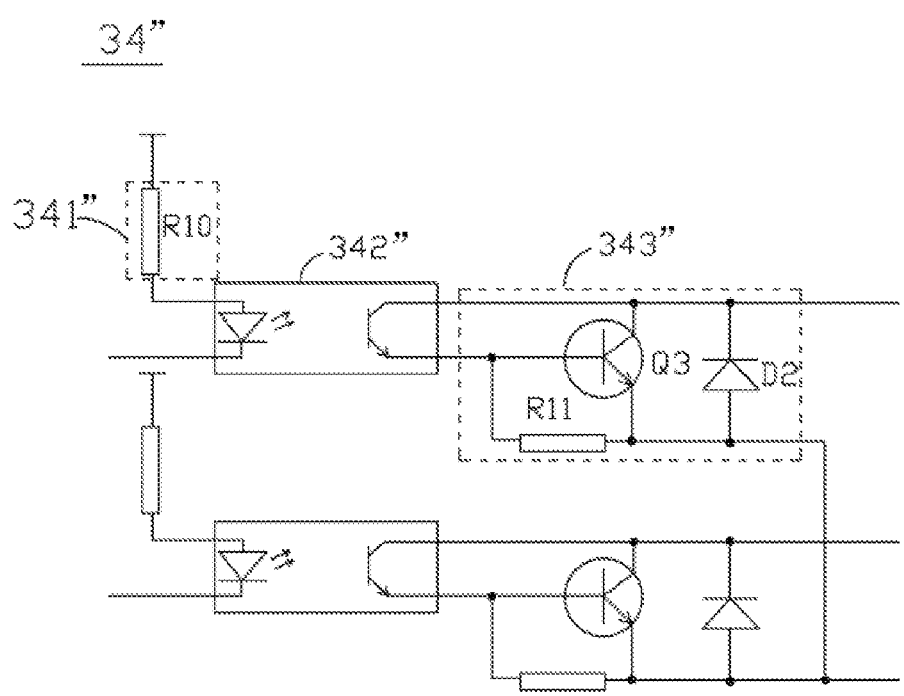

FIG. 17 is the circuit diagram of the low-speed single-ended output signal processing circuit of the fourth type of embodiment of the closed-loop stepper motor control system of the embodiment of the present invention.

MODE FOR THE INVENTION

Mode for Invention

The various characteristics and exemplary embodiments of the present invention shall be described in detail below and the present invention shall be described in further detail below with reference to drawings and embodiments to make the purpose, the technical solution and advantages of the present invention clearer and easier to understand. It must be noted here that the description of these embodiment methods is to facilitate an understanding of the present invention and does not constitute restrictions on the present invention. In addition, the technical characteristics involved in the various embodiment methods of the present invention that are described below can be combined together as long as they do not give rise to conflict.

Please refer to FIG. 1 to FIG. 6. The present invention disclosed a closed-loop stepper motor control system based on the EtherCAT protocol (hereinafter referred to as closed-loop stepper motor control system). It comprises: a microprocessor 1 compatible with EtherCAT communication protocol functions, an external interface circuit 2 connected to the said microprocessor 1 and communication interface unit 3. The said microprocessor 1 is also connected to a drive circuit 4, current testing circuit 5, as well as an encoder feedback circuit 6. The communication interface unit 3 is mutually connected to the said microprocessor 1 through the physical layer communication circuit 31; the said microprocessor 1 is also mutually connected to the power supply circuit 7 that provides a stable power supply voltage. Of which, in this Embodiment, the encoder feedback circuit 6 is directly and mutually connected to the microprocessor 1. It can be understood that in one type of embodiment, the encoder feedback circuit 6 is mutually connected to the microprocessor 1 through the receiver chip.

Optionally, the microprocessor 1 uses at least one of the following processors that are compatible with EtherCAT communication protocol functions: ARM (Advanced RISC Machine) processor, DSP (Digital Signal Processing) processor and FPGA (Field-Programmable Gate Array) processor. Therefore, the control system of the present invention has such advantages as small size, relatively stable and reliable controls, and low cost. In this Embodiment, microprocessor 1 of the present invention is an ARM processor, that is, the present invention is a closed-loop stepper motor control system that uses a single-chip ARM processor. It can be understood that the model number and structure of the microprocessor 1 are not specifically defined here.

Optionally, the external interface circuit 2 comprises the power supply interface unit 21, winding interface unit 22 and I/O interface unit 23; the power supply interface unit 21 is mutually connected to the power supply circuit 7. One end of the winding interface unit 22 is mutually connected to the drive circuit 4 and the other end may be mutually connected to the motor to drive the motor to work. The I/O interface unit 23 is mutually connected to the microprocessor 1 and can input or output various signals.

Optionally, this system also comprises the brake circuit 81. One end of the brake circuit 81 is mutually connected to the I/O interface unit 23 of the external interface circuit 2 and the other end is mutually connected to the microprocessor 1. In this Embodiment, the brake circuit 81 comprises the brake drive circuit 811 and brake 812. Of which, the brake drive circuit 811 comprises the isolation unit 813 and amplifier 814. The microprocessor 1 is connected to the amplifier 814 through the isolation unit 813 and the amplifier 814 is used to amplify the current signal output by the isolation unit 813 to the brake 812.

In this Embodiment, the isolation unit 813 comprises the optoelectronic coupler 815 and the first resistor R1. The anode of the light-emitting diode of the optoelectronic coupler 815 is electrically connected to the first end of the first resistor R1, the cathode of the light-emitting diode of the optoelectronic coupler 815 is electrically connected to the microprocessor 1 and the second end of the first resistor R1 is electrically connected to the power supply Vcc1. The collector and emitter electrodes of the phototransistor of the optoelectronic coupler 815 are electrically connected to the amplifier 814. The optoelectronic coupler 815 has such advantages as fast response speed, arbitrary adjustment of duty ratio and high capacity to resist interference, so it can increase the response speed and capacity to resist interference of the brake circuit 81 of the present invention. In addition, the optoelectronic coupler 815 is a current-type device and it can effectively suppress voltage noise. In one embodiment, the phototransistor of the optoelectronic coupler 815 can be replaced with a photodiode. Therefore, the structure of the isolation unit 813 is not specifically defined here, as long as it can be controlled by the microprocessor 11 and can control the amplifier 814.

The amplifier 814 comprises the signal-amplifying triode Q1 and the second resistor R2. The base electrode of the signal-amplifying triode Q1 is electrically connected to the emitter electrode of the phototransistor, the collector electrode of the signal-amplifying triode Q1 is electrically connected to the collector electrode of the phototransistor and the emitter electrode of the signal-amplifying triode Q1 is grounded. The collector electrode of the signal-amplifying triode Q1 is also electrically connected to the internal coils of the brake 812. In this Embodiment, the amplifier 814 can also be used as the switch circuit to control the output of the current signal to the brake 812. The first end of the second resistor R2 is electrically connected to the base electrode of the signal-amplifying triode Q1 and the second end of the second resistor R2 is electrically connected to the emitter electrode of the signal-amplifying triode Q1. The amplifier 814 of the present invention has such advantages as simple structure and high reliability. In one embodiment, amplifier 814 comprises: a triode, MOSFET transistor or insulated gate bipolar transistor (IGBT), that is, the signal-amplifying triode Q1 can be replaced with a MOSFET transistor or IGBT. Therefore, the structure of the amplifier 814 is not specifically defined here.

The brake circuit 81 also comprises a protection unit 816. One end of the protection unit 816 is connected to the amplifier 814 and the other end is connected to the power supply input end of the brake 812. The internal coils of the brake 812 are an inductive device and inductive devices have relatively large dv/dt (voltage rise rate) during power on/off, which interferes with the reception of commands by the driver and even the normal operations of the entire system. Therefore, the installation of the protection unit 816 may increase the capacity of the brake circuit 81 to resist interference. In this Embodiment, the protection unit 816 is a diode and the diode is set up on the circuit substrate. The anode of the diode is mutually connected to the collector electrode of the signal-amplifying triode Q1 and the cathode of the diode is electrically connected to the power supply input end attached to the brake 812. In one embodiment, the protection unit 816 comprises: a network composing of a diode or resistor and capacitor. Therefore, the structure of the protection unit 816 is not specifically defined here. The protection unit 816 of the present invention has such advantages as simple structure and high reliability.

When being powered on, the microprocessor 1 outputs a low level signal to drive the isolation unit 813 to turn on. The light-emitting diode of the isolation unit 813 emits light and phototransistor conducts to drive the amplifier 814 of the isolation unit 813 to work, that is, the signal-amplifying triode Q1 transmits and current passes through the internal coils of the brake 812. The magnetic field produced by the coils' current renders the motor shaft to be in a free state. When the power supply is cut off, the microprocessor 1 outputs a high level signal, the light-emitting diode is extinguished and the isolation unit 813 turns off. The signal-amplifying triode Q1 stops and no current passes through the internal coils of the brake 812T, so the brake 812 is in a normally closed state and the motor shaft is in a locked state.

Optionally, the I/O interface unit 23 comprises the first output interface 231, the second output interface 232 and the third output interface 233. The first output interface 231 is connected to the first end of the brake 812 (power supply input end), the second output interface 232 is connected to the second end of the brake 812 and the third output interface 233 is connected to the power ground of the brake 812. Setting the first output interface 231, the second output interface 232 and the third output interface 233 makes it easier to connect to the brake 812, making it easier to use.

Optionally, the communication interface unit 3 comprises the physical layer communication circuit 31 and communication interface 32. The communication interface 32 is mutually connected to microprocessor 1 through the physical layer communication circuit 31. The communication interface 32 circuit also comprises an anti-jamming circuit. The anti-jamming circuit is electrically connected to the microprocessor 1 through the physical layer communication circuit 31. The anti-jamming circuit comprises the first common mode inductor a and the first transient voltage suppressor b. The first end of the first transient voltage suppressor b is mutually connected to the first end of the first common mode inductor a. The second end of the first transient voltage suppressor b is mutually connected to the information input socket 321 and the information input socket 22a is the input interface of communication signals.

Specifically, the information input socket 321 may be a RJ45; RJ45 is a type of information socket (that is, the communication terminal) connector of the wiring system.

The first transient voltage suppressor b has an extremely fast response time (sub-nanosecond level) and a relatively high surge absorption capacity. When both of its ends are subject to transient high-energy impact, the first transient voltage suppressor b is able to convert the resistance between the two ends from high impedance to low impedance at a very high speed to absorb the transient large current and clamp the voltage of both of its ends at a pre-set value, thereby protecting the circuit components behind from being impacted by the spike in transient high voltage. The first common mode inductor a is used to filter the electromagnetic interference signals of the common mode. At the same time, it acts as an EMI filter and it is used to suppress the outward radiation emission of electromagnetic waves produced by the high-speed signal line. Therefore, the closed-loop stepper motor control system has the advantage of high capacity to resist interference.

In this Embodiment, the anti-jamming circuit is connected to the first transformer c. The first transformer c is electrically connected to the first common mode inductor a and the first transformer c is used to send the signal coming from the first common mode inductor a to the microprocessor 1. The communication interface unit 3 also comprises the debugging interface 33 used to debug parameters and the debugging interface 33 is mutually connected to the microprocessor 1. The debugging interface 33 here is preferably a USB interface.

Optionally, the anti-jamming circuit also comprises the second transient voltage suppressor d and the second common mode inductor e. The second end of the first transformer c is electrically connected to the first end of the second transient voltage suppressor d. The second end of the second transient voltage suppressor d is electrically connected to the first end of the second common mode inductor e and the second end of the second common mode inductor e is electrically connected to the microprocessor 1 through the first physical layer port 311. Therefore, the closed-loop stepper motor control system has the advantage of high capacity to resist interference.

Optionally, the anti-jamming circuit also comprises the third common mode inductor f and the third transient voltage suppressor g. The first end of the third transient voltage suppressor g is mutually connected to the first end of the third common mode inductor f and the second end of the third transient voltage suppressor g is mutually connected to the information output socket 322. The information output socket 322 is the output interface of communication signals. Specifically, the information output socket 322 is a RJ45. The third transient voltage suppressor g has an extremely fast response time (sub-nanosecond level) and a relatively high surge absorption capacity. When both of its ends are subject to transient high-energy impact, the third transient voltage suppressor g is able to convert the resistance between the two ends from high impedance to low impedance at a very high speed to absorb the transient large current and clamp the voltage of both of its ends at a pre-set value, thereby protecting the circuit components behind from being impacted by the spike in transient high voltage. The third common mode inductor f is used to filter the electromagnetic interference signal of the common mode. At the same time, it acts as an EMI filter and it is used to suppress the outward radiation emission of electromagnetic waves produced by the high-speed signal line. Therefore, the closed-loop stepper motor control system has the advantage of high capacity to resist interference.

Optionally, the anti-jamming circuit is connected to the second transformer h. The first end of the second transformer h is electrically connected to the third common mode inductor f and the second transformer h is used to send the signal coming from the third common mode inductor f to the microprocessor 1.

Optionally, the anti-jamming circuit also comprises the fourth transient voltage suppressor i and the fourth common mode inductor j. The second end of the second transformer h is electrically connected to the first end of the fourth transient voltage suppressor i, the second end of the fourth transient voltage suppressor i is electrically connected to the first end of the fourth common mode inductor j and the second end of the fourth common mode inductor j is electrically connected to the microprocessor 1 through the second physical layer port. Therefore, the closed-loop stepper motor control system has the advantage of high capacity to resist interference.

Optionally, this system also comprises the DIP switch unit 82. The DIP switch unit 82 is mutually connected to the microprocessor 1 and the DIP switch unit 82 is used to set the parameters of this system, making it more convenient for users to use. Preferably, the DIP switch unit 82 comprises a rotary DIP switch. It can be understood that the quantity of rotary DIP switches may be set as needed, and this is not specifically defined here.

Optionally, this system also comprises an overcurrent protection circuit 83. One end of the overcurrent protection circuit 83 is connected to the microprocessor 1 and the other end is electrically connected to the drive circuit 4. The drive circuit 4 is better protected by setting the overcurrent protection circuit so as to prevent it from being burning out by the overcurrent. In this Embodiment, the drive circuit 4 comprises a drive chip 41 and an inverter bridge circuit 42. The drive chip 41 of the drive circuit 4 is mutually connected to the microprocessor 1 and the drive chip 41 is mutually connected to the winding interface unit 22 through the inverter bridge circuit 42.

Optionally, this system also comprises a display unit 84. The display unit 84 is electrically connected to the microprocessor 1 and it is used to display the work state of this system. Of which, the display unit 84 comprises one or several of the following types: LED indicator light, digital tube and liquid crystal display. Therefore, the closed-loop stepper motor control system has such advantages as abundance of display and ease of use. Preferably, this system also comprises an alarm unit 85. The alarm unit 85 is electrically connected to the microprocessor 1 and the alarm unit 85 sends an alarm signal when there is an anomaly in this system. Of which, the alarm unit 85 can be an LED alarm indicator light or buzzer, etc., as long as it is able to send an alarm signal, so this is not specifically defined here.

It can be seen from this that the closed-loop stepper motor control system of the present invention comprises: a microprocessor 1 compatible with EtherCAT communication protocol functions, an external interface circuit 2 connected to the said microprocessor 1 and communication interface unit 3.

The said microprocessor 1 is also connected to a drive circuit 4, current testing circuit 5, as well as an encoder feedback circuit 6. The communication interface unit 3 is mutually connected to the said microprocessor 1 through the physical layer communication circuit; the said microprocessor 1 is also mutually connected to the power supply circuit 7 that provides a stable power supply voltage. The application of fieldbus technology to the stepper motor control system provides greater reliability and convenience to the closed-loop motor control system under multi-shaft application scenarios, through mutual cooperation by the various said modules. In addition, it is also able to save wiring materials and labor costs; high-speed networking increases the monitoring of devices, and this drastically increases the overall capacity to resist interference and increases the overall value of device products.

The structure of this Embodiment is similar to Embodiment 1, with the difference being: The brake circuit 81 also comprises a switch unit (not shown in the figure) and the switch unit is connected in series to the amplifier 814. In this Embodiment, the switch unit is a transistor switch and the transistor switch is electrically connected to the microprocessor 1. When the microprocessor 1 drives the isolation unit 813 to turn on, the microprocessor 1 simultaneously drives the switch unit to turn on. When the microprocessor 1 controls the isolation unit 813 to turn off, the microprocessor 1 simultaneously controls the switch unit to turn off, thereby increasing the reliability of the brake circuit 81. Of which, the transistor switch can comprise a silicon-controlled resistor or field-effect transistor. Of course, it can also be another type of switch, so its structure is not specifically defined here.

Please refer to FIGS. 7 to 13. The structure of this Embodiment is similar to Embodiment 1, with the difference being: The closed-loop stepper motor control system based on the EtherCAT protocol of this Embodiment also comprises a pedestal 11', a shell 1' compatible with the pedestal 11', a circuit substrate 14' used to drive the motor that is installed on the said pedestal 11' and the interface unit 21$a$' mutually connected to the circuit substrate 14'. Of which, both opposite sides of the said shell 1' are respectively installed with the first assembly guide slot c' and the second assembly guide slot d'. The said shell 1' is also installed with at least one of the first installation bayonet e' mutually connected to the pedestal. The said pedestal is installed with at least one of the second installation bayonet f' connected to the said shell, the third installation bayonet a' connected to the external device and the fourth installation bayonet b'. The position of the said first installation bayonet e' corresponds to the position of the said second installation bayonet f', the position of the said third installation bayonet a' corresponds to the said first assembly guide slot c' and the position of the said fourth installation bayonet b' corresponds to the position of the said second assembly guide slot d'. The present invention makes it easy for the user to install and secure the stepper motor driver at the designated position by installing the said first assembly guide slot c', the second assembly guide slot d', the third installation bayonet a' and the fourth installation bayonet b', where the position of the said third installation bayonet a' corresponds to the said first assembly guide slot c' and the position of the said fourth installation bayonet b' corresponds to the said second assembly guide slot d', minimizing the impact from external ambient light; this makes blind operations easy for the user during installation, heightening installation efficiency and greatly improving user experience.

Furthermore, the said third installation bayonet a' and the fourth installation bayonet b' are respectively installed on the two opposite ends of one side of the said pedestal 11' or diagonally on the pedestal. The cross-sectional area of the said first assembly guide slot c' increases gradually in the direction away from the said third installation bayonet a' to the said third installation bayonet a'. The cross-sectional area of the said second assembly guide slot d' increases gradually in the direction away from the said fourth installation bayonet b' to the said fourth installation bayonet b'. This design makes it easy to guide the screw to turn along the first assembly guide slot c' and the second assembly guide slot d' and quickly secure the corresponding third installation bayonet a' and the fourth installation bayonet b', respectively. The cross-sectional area of the said first assembly guide slot c' and the second assembly guide slot d' increases gradually in the direction towards the corresponding third installation bayonet a' and the fourth installation bayonet b', making it easy for blind operations during installation. Users do not need to look for the installation hole that is difficult to see in the cabinet where lighting is poor or with the help of an external light source. The shell is generally made of plastic and other non-metal materials. The first assembly guide slot c' and the second assembly guide slot d' are installed on the shell made with a non-metal material, so the production and manufacturing cost is low, reducing the overall cost of the stepper motor driver.

In addition, the first assembly guide slot c' and the second assembly guide slot d' of the present invention are respectively installed at the junction of two side walls of the shell 1'. This effectively uses the structural space of the stepper motor driver and does not increase the installation dimensions of the stepper motor driver, so it effectively saves space in the customer's cabinet and makes it easier to realize miniaturization of devices. It can be understood that the said first assembly guide slot c' may have a circular groove structure, cylindrical groove structure or prismatic groove structure, etc. Similarly, the said second assembly guide slot d' may also have a circular groove structure, cylindrical groove structure or prismatic groove structure, etc. Therefore, the structure of the said first assembly guide slot c' and the said second assembly guide slot d' are not specifically defined here.

The said shell 1' comprises the first shell 12' and the second shell 13'. The said pedestal 11' is installed with the first side wall 111' and the second side wall 112' and the said first side wall 111' is mutually connected to the said second side wall 112'. The said first shell 12' is installed with the third side wall 121', the fourth side wall 122' and the fifth side wall 123'. The two ends opposite the position of the said fourth side wall 122' is mutually connected to the said third side wall 121' and the said fifth side wall 123', respectively.

The position of the said third side wall 121' is opposite the said fifth side wall 123' and the position of the said fourth side wall 122' is opposite the said second side wall 112'. The said second shell 13' is installed with the sixth side wall 131' opposite the said first side wall 111'. The third installation bayonet a' and the fourth installation bayonet b' are respectively installed on both opposite ends of the said first side wall 111'.

Of which, the left and right sides of the said shell 1' are installed with the first assembly guide slot c' and the second assembly guide slot d'. The said shell 1 is also installed with the first installation bayonet e' to be connected to the pedestal 11'. The said pedestal 11' is installed with the second installation bayonet f' to be connected to the said shell 1' and the third installation bayonet a' and the fourth installation bayonet b' to be connected to the external device. The position of the said first installation bayonet e' corresponds to the said second installation bayonet f', the position of the said third installation bayonet a' corresponds to the said first assembly guide slot c' and the position of the said fourth installation bayonet b' corresponds to the said second assembly guide slot d'.

Preferably, the said shell 1' and the said pedestal 11' can be detached and connected to facilitate repairs.

Specifically, the said first assembly guide slot c' is installed at the junction between the said third side wall 121' and the said fourth side wall 122' and the said first assembly guide slot c' is mutually connected to the said third installation bayonet a'. The said second assembly guide slot d' is installed at the junction between the said fourth side wall 122' and the said fifth side wall 123' and the said second assembly guide slot d' is mutually connected to the said fourth installation bayonet b'.

Preferably, the said third installation bayonet a' is a circular through-hole, U-shaped groove or circular groove and the said fourth installation bayonet b' is a circular through-hole, U-shaped groove or circular groove. In the preferred embodiments of the present invention, the said third installation bayonet a' is a circular through-hole and the said fourth installation bayonet b' is a U-shaped groove. The said U-shaped groove is mutually connected to the end face of the said first side wall 111'.

When the present invention is secured onto the target object, the stepper motor driver is installed from the side. The usual installation habit of users is to generally screw the bottom and to hang the stepper motor driver for pre-positioning and load-bearing. The third installation bayonet a' or the fourth installation bayonet b' below the stepper motor driver is set to be a U-shaped groove ("U"-shaped bayonet), which makes it very easy for the customer to place on the positioned screw (equivalent to hanging the stepper motor driver up) and to position and lock the screw above. The third installation bayonet a' or another in the fourth installation bayonet b' on the stepper driver is set to be a circular hole ("O"-shape bayonet) to mainly have a positioning function, allowing for more accurate positioning. Preferably, the said third installation bayonet a' or the fourth installation bayonet b' is designed to be near the right side when the stepper motor driver is installed from the side.

This is in line with the habits of most people, who would hold the driver in their left hand and use the screwdriver with their right hand. Not only does the cooperation between the said third installation bayonet a' and the fourth installation bayonet b' make assembly easy, but also it is more reliable when being secured on the target object, and the target object does not drop easily.

In this Embodiment, the said pedestal 11' is a metal part and the said first shell 12' and the second shell 13' are plastic parts, so the overall weight is light and it is easy to transport and assemble. It can be understood that the materials of the said pedestal 11', the first shell 12' and the second shell 13' are not specifically defined here.

The end face of the two ends opposite the position of the said second side wall 112' is installed with the said second installation bayonet f'. The cross-section of the said first installation bayonet e' and the said second installation bayonet f' is round.

The said first shell 12' covers the said pedestal 11' and it is tightly secured and connected with bolts and screw threads inserted on the said first installation bayonet e' and the said second installation bayonet f'; the said third side wall 121' and the said fifth side wall 123' of the said first shell 12' are respectively connected to the edges of the two ends opposite the said second side wall 112' of the said pedestal 11' The said pedestal 11' and the said first shell 12' form a housing chamber. The said second shell 13' covers the opening of the said housing chamber and the said first shell 12' and the said second shell 13' are snapped together and mutually connected through the snap joint 1231' and snap hook 133'. Specifically, the said first shell 12' is installed with a snap joint 1231' and the said second shell 13' is installed with a snap hook 133'. The said snap hook 133' and the said snap joint 1231' are snapped together and mutually connected to snap and mutually connect the said second shell 13' and the said first shell 12'. Therefore, its structure is relatively compact and easy to assemble. In addition, the first shell 12' and the second shell 13' can also become a one-piece structure.

The said fourth side wall 122' is installed with a limit slot 124' and the said second shell 13' is installed with a limit ridge 132' matching the said limit slot 124'. The said limit ridge 132' is inserted into the said limit slot 124', better preventing the formation of a gap between the said second shell 13' and the said first shell 12'. This also prevents external dust and other miscellaneous items from falling into the said housing chamber. Preferably, the said third installation bayonet a' and the said fourth installation bayonet b' are positioned between the plane of the outer wall surface of the said third side wall 121' and the plane of the outer wall surface of the said fifth side wall 123', so a protruding installation position is not required; there will be no bulge and the size is small, which makes it easy to pack and transport. In this Embodiment, the said third installation bayonet a' and the fourth installation bayonet b' are on the same side of the said first side wall 111', so it is easy to tighten the screw with the right hand during installation, and this is ergonomic and easier to assemble. In addition, this does not require the installation of a guide slot on the metallic-material first shell 12' when installing diagonally, which would otherwise lead to overly-high cost problems.

The said closed-loop stepper motor control system based on the EtherCAT protocol also comprises a circuit substrate 14' and thermal insulation part 15'. The said circuit substrate 14' is installed in the said shell 1', that is the said circuit substrate 14' is positioned in the said housing chamber and several power tubes 16' are installed with intervals on one side of the said circuit substrate 14' that is facing the said second side wall 112'. The said thermal insulation part 15' is installed between the said power tubes 16' and the said second side wall 112', and the two sides opposite the said thermal insulation part 15' are positioned against the power tubes 16' and the said second side wall 112'. The said second side wall 112' is a thermal conductive metal plate. The said thermal insulation part 15' conducts heat from several power tubes 16' to the said shell 1', so this can extend the service life of the said power tubes 16'. In this Embodiment, the said several power tubes 16' and the said thermal insulation part 15' are positioned at one end of the said circuit substrate 14', so the structure is more compact and it makes production easy. One side of the said second side wall 112' with back facing the said power tubes 16' is installed with several heat sink fins at intervals, so this is able to further increase efficiency in heat dissipation.

The said circuit substrate 14' is installed with several mounting holes 141' to secure it to the said second side wall 112', the insulation ring 17' installed on the said mounting holes 141', and the fixed column 18'. The said fixed column 18' goes through the said mounting holes 141' and the said insulation ring 17' to secure the said circuit substrate 14' to the said second side wall 112'. The installation of the said insulation ring 17' better prevents circuit contact between the said fixed column 18' and the said circuit substrate 14', which may otherwise cause a short circuit of the circuit substrate 14'. In this Embodiment, the said insulation ring 17' comprises the said fixed part 171' inserted in the said mounting holes 141' and the limit part 172' outside of the said mounting holes 141'. The cross-sectional area of the said limit part 172' is greater than the cross-sectional area of the said fixed part 171', so this makes it easy to assemble.

The said interface unit 21*a*' comprises: the power supply interface unit 21, winding interface unit 22, encoder interface unit 23', I/O interface unit 23 and the communication interface unit 22'. The said power supply interface unit 21, winding interface unit 22, encoder interface unit 23', I/O interface unit 23 and communication interface unit 22' are successively installed on one side of the shell 1'. The said debugging interface 33 is installed on one side wall of the said shell 1'. The said DIP switch and the said debugging interface 33 are installed on the same side wall of the said shell 1'. The said encoder interface unit 23' is mutually connected to the said encoder feedback circuit 14.

In one embodiment of the present invention, the communication interface unit 22' is positioned at the first end of the said I/O interface unit 23 and the encoder interface unit 23' is positioned at the second end of the said I/O interface unit 23;

the external wires do not entangle easily during use, making it convenient for users to use, and the user experience is good. The terminals of the said I/O interface unit 23 is greater than 10 bits and the terminals of the said I/O interface unit 23 are connected to one connector 20' and they are arranged in two rows and opposite each other, that is, the terminals of the said I/O interface unit 23 are arranged in two rows and the said terminals of one of the rows are installed correspondingly one-to-one to the said terminals of the other row, and the said I/O interface unit 23 is mutually connected to the external device through the said connector 20'. The installation of the said connector 20' makes the connection to the signal line convenient, which is easier for users to use.

It can be understood that the said communication interface unit 22' and the said encoder interface unit 23' can be in contact with or a pre-set distance away from the said I/O interface unit 23, so this is not specifically defined here. In this Embodiment, the said communication interface unit 22' and the said encoder interface unit 23' are respectively positioned at both opposite ends of the said I/O interface unit 23. The said I/O interface unit 23 is used to input and/or output the control signal. The said communication interface unit 22' is used to connect to an external bus and the said encoder interface unit 23' is used to electrically connect to the stepper motor to obtain the position information of the stepper motor. Of which, the said closed-loop stepper motor control system based on the EtherCAT protocol is also called a hybrid servo driver, stepper servo driver, etc. and its characteristics are: The principles of closed-loop control are used to drive the stepper motor with position feedback. The communication interface unit 22' is a RJ45 interface and the used communication protocol comprises one or several of the following types:EtherCAT protocol, RTEX protocol and CAN open protocol.

The sixth side wall 131' of the said shell 1' is installed with at least one of the first interface through-hole 21*b*' that matches the said interface unit 21*a*'. At least part of the said interface unit 21*a*' is in the said first interface through-hole 21*b*'.

The said winding interface unit 22 is on one side of the said encoder interface unit 23' with its back facing the said I/O interface unit 23. The said winding interface unit 22 and the said encoder interface unit 23' are a pre-set distance apart, so this prevents mutual interference of signals between the said winding interface unit 22 and the said encoder interface unit 23', making it convenient for users to use. Preferably, the said winding interface unit 22 is 1-2.5 mm apart from the said encoder interface unit 23'. In this Embodiment, the said winding interface unit 22 is 1.5 mm apart from the said encoder interface unit 23'. It can be understood that the distance between the said winding interface unit 22 and the said encoder interface unit 23' is not specifically defined here. The said power supply interface unit 21 is positioned at the side of the said winding interface unit 22 that is away from the said I/O interface unit 23, that is, the said winding interface unit 22 and the said power supply interface unit 21 are installed on one end of the said shell 1', making it easy to connect to the external power supply.

The said display unit 84 is positioned on one side of the said communication interface unit 22' with its back facing the said I/O interface unit 23, so it better prevents the external wires from blocking it, thereby making it easy for the user to observe the working state of the present invention. In order to better prevent the wires mutually connected to the present invention from being entangled, and to make it convenient for users to use, the said display unit 84, the said communication interface unit 22', the said I/O interface unit 23, the said encoder interface unit 23', the said winding interface unit 22 and the said power supply interface unit 21 are installed successively and in a line on the sixth side wall 131' of the said shell 1'. In other words, the said display 84, the said communication interface unit 22', the said I/O interface unit 23, the said encoder interface unit 23', the said winding interface unit 22 and the said power supply interface unit 21 are on the same line, which makes it more convenient for users to use.

Preferably, the adjacent surface of the main surface on the said first shell, that is, the third side wall 121' of the said shell 1' is installed with the second interface through-hole 27*a* matching with the said DIP switch unit 82; at least part of the said DIP switch unit 82 is in the said second interface through-hole 27*a*. The said second interface through-hole 27*a* matches the debugging interface 33 and DIP switch.

Furthermore, the said DIP switch unit 82 is installed on the third side wall 121' of the said shell 1'. The said debugging interface 33 is also installed on the third side wall 121' of the said shell 1', and it is set at a pre-set distance away from the said DIP switch unit 82. The said DIP switch unit 82 and the said debugging interface 33 are installed on the third side wall 121', so they are easy to maintain and use.

Preferably, the said connector 20' comprises the socket 201' and wiring hole 202'. The said socket 201' fits the terminal of the said I/O interface unit 23 and the said wiring hole 202' is connected to the signal line. Preferably, the said connector 20' also comprises an elastic pressing member 203' correspondingly installed to each wiring hole 202'. During use, insert the said signal line into the said wiring hole 202', then press the said elastic pressing member 203' so that the said elastic pressing member 203' is clamped onto the said signal line, tightly connecting the signal line and the said connector 20'; this makes it easier to connect to the said signal line.

Please refer to FIGS. 14 to 17. The structure of this Embodiment is similar to Embodiment 1, with the difference being: the closed-loop stepper motor control system of this Embodiment also comprises a high-speed differential input signal processing circuit 31", low-speed signal input processing circuit 32", low-speed differential output signal processing circuit 33" and low-speed single-ended output signal processing circuit 34".

In this Embodiment, the high-speed differential input signal processing circuit 31" comprises the first current-limiting unit 311", anti-reverse connection unit 312", first filter unit 313", first high-speed signal isolation unit 314 and the second filter unit 315". The first current-limiting unit 311" and the anti-reverse connection unit 312" are electrically connected to the first filter unit 313", and the first high-speed signal isolation unit 314" and the first filter unit 313" are electrically connected to the second filter unit 315". In this Embodiment, there are two first current-limiting units 311". Each of the first current-limiting unit 311" comprises the third resistor R3 and fourth resistor R4 that are connected in parallel. The first end of the third resistor R3 and the first end of the fourth resistor R4 are electrically connected to the I/O interface unit 33. The second end of the third resistor R3 and the second end of the fourth resistor R4 are connected to the first high-speed signal isolation unit 314".

The anti-reverse connection unit 312" comprises the first diode D1. The anode of the first diode D1 is electrically connected to the I/O interface unit 33 and the cathode of the first diode D1 is mutually connected to the fourth resistor R4. The first filter unit 313" comprises the first capacitor C1 and the first capacitor C1 is connected in parallel to the first diode D1. The second filter unit 315" comprises the second capacitor C2, the fifth resistor R5 and sixth resistor R4. The first end of the fifth resistor R5 is electrically connected to the first high-speed signal isolation unit 314", the second end of the fifth resistor R5 is electrically connected to the microprocessor, the first end of the sixth resistor R4 is mutually connected to the first end of the fifth resistor R5, the first end of the second capacitor C2 is mutually connected to the second end of the fifth resistor R5 and the second end of the second capacitor C2 is grounded. The high-speed differential input signal processing circuit 31" of the present invention has such advantages as simple structure and stable and reliable signal transmission.

The low-speed signal input processing circuit 32" comprises the second current-limiting unit 321", the third filter unit 322", the second isolation unit 323" and the fourth filter unit 324". The second current-limiting unit 321" and I/O interface unit 33 are electrically connected to the second isolation unit 323", the third filter unit 322" is electrically connected to the second current-limiting unit 321" and the fourth filter unit 324" and the second isolation unit 323" are electrically connected to the microprocessor. In this Embodiment, the second current-limiting unit 321" comprises the seventh resistor R7. The first end of the seventh resistor R7 is electrically connected to the I/O interface unit 33 and the second end of the seventh resistor R7 is electrically connected to the second isolation unit 323". The third filter unit 322" comprises the third capacitor C3. The first end of the third capacitor C3 is electrically connected to the I/O interface unit 33 and the second end of the third capacitor C3 is electrically connected to the second end of the seventh resistor R7. The fourth filter unit 324" comprises the fourth capacitor C4. The first end of the fourth capacitor C4 and the second isolation unit 323" are electrically connected to the microprocessor and the second end of the fourth capacitor C4 is grounded. In this Embodiment, there are several of the second current-limiting unit 321", the third filter unit 322", the second isolation unit 323" and the fourth filter unit 324". It can be understood that the quantity of the second current-limiting unit 321", the third filter unit 322" the second isolation unit 323" and the fourth filter unit 324" can be set as needed, so this is not specifically defined here. The low-speed signal input processing circuit 32" of the present invention has the advantage of a simple structure.

The low-speed differential output signal processing circuit 33" comprises the third current-limiting unit 331", the third isolation unit 332" and the first signal-amplifying unit 333". The third current-limiting unit 331" is electrically connected to the third isolation unit 332" and the first signal-amplifying unit 333" is electrically connected to the third isolation unit 332". In this Embodiment, the third current-limiting unit 331" comprises the eighth resistor R8. The first end of the eighth resistor R8 is connected to the first power supply and the second end of the eighth resistor R8 is electrically connected to the third isolation unit 332". The first signal-amplifying unit 333" comprises the first triode Q2, the second diode D2 and the ninth resistor R9. The base electrode of the first triode Q2 is electrically connected to the third isolation unit 332", the emitter electrode of the first triode Q2 is electrically connected to the I/O interface unit 33 and the collector electrode of the first triode Q2 and the third isolation unit 332" are electrically connected to the I/O interface unit 33. The anode of the second diode D2 is electrically connected to the emitter electrode of the first triode Q2 and the cathode of the second diode D2 is electrically connected to the collector electrode of the first triode Q2. The first end of the ninth resistor R9 is mutually connected to the base electrode of the first triode Q2 and the second end of the ninth resistor R9 is electrically connected to the emitter electrode of the first triode Q2. Its signal transmission is stable and reliable.

The low-speed single-ended output signal processing circuit 34" comprises the fourth current-limiting unit 341", the fourth isolation unit 342" and the second signal amplifying unit 343". The fourth current-limiting unit 341" is electrically connected to the fourth isolation unit 342" and the second signal-amplifying unit 343" is electrically connected to the fourth isolation unit 342". In this Embodiment, the fourth current-limiting unit 341" comprises the tenth resistor R310. The first end of the tenth resistor R310 is connected to the first power supply and the second end of the tenth resistor R310 is electrically connected to the fourth isolation unit 342". The second signal-amplifying unit 343" comprises the second triode Q3, the third diode D3 and the eleventh resistor R31. The base electrode of the second triode Q3 is electrically connected to the fourth isolation unit 342", the emitter electrode of the second triode Q3 is electrically connected to the I/O interface unit 33 and the collector electrode of the second triode Q3 and the fourth isolation unit 342" are electrically connected to the I/O interface unit 33. The anode of the third diode D3 is electrically connected to the emitter electrode of the second triode Q3 and the cathode of the third diode D3 is electrically connected to the collector electrode of the second triode Q3. The first end of the eleventh resistor R31 is mutually connected to the base electrode of the second triode Q3 and the second end of the eleventh resistor R31 is electrically connected to the emitter electrode of the second triode Q3. In this Embodiment, there are several fourth current-limiting units 341", fourth isolation units 342" and second signal-amplifying units 343". It can be understood that the quantity of the fourth current-limiting unit 341", the fourth isolation unit 342" and the second signal-amplifying unit 343" may be set as needed, so this is not specifically defined here.

The present invention also disclosed a drive device, which comprises: the closed-loop stepper motor control system as shown in the various said embodiments. Therefore, it also has the same technical effects.

The present invention also disclosed an automation device, which comprises: the drive device as shown in the said embodiments.

The preferred embodiments above describe the purpose, technical solution and advantages of the present invention in detail. The descriptions of the above embodiments are only to facilitate an understanding of the methods and core ideas of the present invention. At the same time, based on the ideas of the present invention, there may be changes to the specific embodiment methods and scope of application by those of ordinary skill in the art. In addition, the "first","second" and similar terms used in the present invention do not represent any order, quantity or significance, and are only used to differentiate different objects. In conclusion, the content of this Specification only describes the embodiment methods of the present invention and shall not restrict the protection scope of the patent of the present invention. All equivalent structures or equivalent process transformations based on the specification and drawings of the present invention, or direct or indirect applications thereof in other relevant technical fields shall be similarly covered by the protection scope of patent of the present invention. This shall not be construed as a restriction of the present invention.

The invention claimed is:

1. A closed-loop stepper motor control system, wherein it comprises:
   a microprocessor compatible with EtherCAT communication protocol functions,
   an external interface circuit connected to the microprocessor and a communication interface unit; the microprocessor is also connected to a drive circuit, a current testing circuit, as well as an encoder feedback circuit;
   the communication interface unit is mutually connected to the microprocessor through a physical layer communication protocol circuit;
   wherein the communication interface unit further comprises the physical layer communication protocol circuit and a communication interface, and the communication interface is mutually connected to the microprocessor through the physical layer communication protocol circuit;
   wherein the communication interface circuit also comprises an anti-interference circuit, and the anti-interference circuit is electrically connected to the microprocessor through the physical layer communication protocol circuit; and
   the microprocessor is also mutually connected to a power supply circuit that provides to the closed loop stepper motor control system stable power supply voltage, and resists interference.

2. The closed-loop stepper motor control system as claimed in claim 1, wherein the microprocessor uses at least one of the following processors that are compatible with EtherCAT communication protocol functions: ARM processor, DSP processor or FPGA processor.

3. The closed-loop stepper motor control system as claimed in claim 1, wherein the external interface circuit comprises a power supply interface unit, a winding interface unit and an I/O interface unit; the power supply interface unit is mutually connected to a power supply circuit, one end of the winding interface unit is mutually connected to the drive circuit and the other end is mutually connected to a motor; and the I/O interface unit is mutually connected to the microprocessor.

4. The closed-loop stepper motor control system as claimed in claim 1, further includes a brake circuit; one end of the said brake circuit is mutually connected to an I/O interface unit of an external interface circuit and the other end is mutually connected to the microprocessor.

5. The closed-loop stepper motor control system as claimed in claim 4, wherein the brake circuit comprises a brake drive circuit and a brake; the brake drive circuit comprises an isolation unit and an amplifier, the microprocessor is connected to the amplifier through the isolation unit and the amplifier is used to amplify current signal coming from the isolation unit and to output to the brake.

6. The closed-loop stepper motor control system as claimed in claim 5, wherein the I/O interface unit comprises a first output interface, a second output interface and a third output interface; the first output interface is connected to a first end of the brake, the second output interface is connected to a second end of the brake and the third output interface is connected to a power supply grounding end of the brake.

7. The closed-loop stepper motor control system as claimed in claim 1, wherein the anti-interference circuit comprises a first common mode choke and a first transient voltage suppressor; and wherein the transient voltage suppressor is connected to one end of the first common mode choke.

8. The closed-loop stepper motor control system as claimed in claim 7, wherein the anti-interference circuit is connected to a first transformer; the first transformer is electrically connected to the first common mode choke and the first transformer is used to send the signal coming from the first common mode choke to the microprocessor.

9. The closed-loop stepper motor control system as claimed in claim 1, further includes a DIP switch unit; the DIP switch unit is mutually connected to the microprocessor.

10. The closed-loop stepper motor control system as claimed in claim 1, further includes a display unit; the display unit is electrically connected to the microprocessor; and wherein the display unit is selected from a group consisting of a LED an indicator light, a digital tube, a liquid crystal display; and any combination thereof.

11. The closed-loop stepper motor control as claimed in claim 1, further includes an alarm unit; and wherein the alarm unit is electrically connected to the microprocessor.

* * * * *